Aug. 29, 1961 J. J. A. P. VAN AMSTEL 2,998,557

SEMI-CONDUCTOR BARRIER LAYER SYSTEMS

Filed Sept. 3, 1959

INVENTOR
Johannes Jacobus Asuerus Ploos van Amstel

BY Frank R. Jufari
AGENT

United States Patent Office 2,998,557

Patented Aug. 29, 1961

2,998,557

SEMI-CONDUCTOR BARRIER LAYER SYSTEMS

Johannes Jacobus Asuerus Ploos van Amstel, Emmasingel, Eindhoven, Netherlands, assignor to North American Philips Company, Inc., New York, N.Y., a corporation of Delaware Filed Sept. 3, 1959, Ser. No. 837,799
Claims priority, application Netherlands Sept. 16, 1958
14 Claims. (Cl. 317—234)

Figure 1:
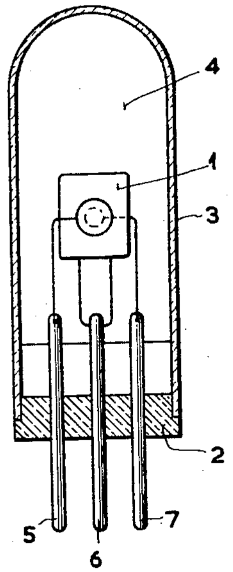

This invention relates to semi-conductor barrier layer systems, more particularly transistors or crystal diodes, provided with hermetically sealed envelopes, and also to methods of manufacturing such semi-conductor barrier layer systems in which these systems are accommodated in hermetically sealed envelopes.

Experience has shown that after use for some time the electrical properties of the semi-conductor barrier layer systems, for example comprising a semi-conductor body of germanium or silicon, greatly deteriorate, especially if they are exposed to high temperatures or heavy loads, even if they are mounted in hermetically sealed or vacuum-tight envelopes. In transistors, this phenomenon particularly shows itself in a sharp decrease of the current amplification factor $\alpha_{bc}$, while in crystal diodes the increase of the leakage current is inconvenient. The term "current amplification factor $\alpha_{bc}$" as used herein is to be understood to mean the quantity which is defined by the equation $$\alpha_{bc}=\left(\frac{\Delta I_c}{\Delta I_b}\right)V_{ce}$$

where $\Delta I_c$ and $\Delta I_b$ represent slight variations in the collector current $I_c$ and base current $I_b$ respectively, which are measured at a constant potential difference $V_{ce}$ between the emitter and collector contacts.

In order to prevent this inconvenient deterioration of the electrical properties, a method of stabilisation has already been proposed which is known as "vacuum baking," in which the semi-conductor barrier layer system during mounting is heated for some hours to a high temperature, for example 140° C., in a vacuum before the envelope is sealed. Although in this manner stable transistors and crystal diodes are obtained, this process has a serious limitation in that the stability is obtained at the expense of the electrical properties, for example in transistors at the expense of the value of the current amplification factor which, during this treatment, decreases steadily to a very low, though stable, value. This process has a further limitation in that the barrier layer system must be mounted in conditions which can hardly be maintained, that is to say, in a vacuum.

It is an object of the present invention to provide a simple measure by which semi-conductor barrier layer systems can be obtained which have not only a high stability but also favourable electrical properties.

According to the present invention, in a barrier layer system, more particularly a transistor or a crystal diode, the space between the envelope and the barrier layer system proper contains at least one stabilizing substance from the group comprising sulphides, selenides, tellurides, phosphorus, antimony, bismuth and compounds or alloys containing at least one of the latter three elements. The term "barrier layer system proper" is used herein to denote the semi-conductor body together with the electrodes and supply leads it requires to fulfill its function. The expression "in the space between the envelope and the barrier layer system proper" should consequently be interpreted so broadly that the stabilizing substance is also considered to be present in this space if this substance is bound to the envelope or any mounting support or to the barrier layer system proper, unless it fulfills, either in the form or in the amount in which it is provided, only a doping function, that is to say a function determining a conduction type and/or conductivity in an electrode on the semi-conductor system. It has been found that the quantities generally used in an electrode for doping purposes are too slight to ensure the stabilizing effect.

The stabilizing substance can be introduced in the envelope in a variety of manners. Since the stabilizing effect is due to the action of the stabilizing substance upon the semi-conductor body, the stabilizing substance is provided in the space so that it can reach the semi-conductor surface from the store, for example in the form of a vapour. A preferred embodiment of a semi-conductor barrier layer system provided with a hermetically sealed envelope in accordance with the invention is that in which the envelope is filled, at least in part, with a filler or binder with which at least one of the said stabilizing substances is intimately mixed. A highly appropriate mixing ratio is from 0.1 to 10% by weight of stabilizing substance, more particularly about 5% by weight of stabilizing substance, although outside these limits satisfactory results can also be obtained. It has been found that particularly suitable fillers are silico-organic polymers of which a few are known as silicone grease and silicone oil and are commercially available under the tradenames "Dow Corning DC 7" and "Dow Corning 702." Another favourable embodiment is that in which the stabilizing substance is provided within the enevolpe so as to be separated from the barrier layer system proper by a porous wall made, for example, of asbestos or quartz wool.

According to a further aspect of the invention, which relates to the method of manufacturing, during mounting at least one of the previously mentioned stabilizing substances is provided in the space between the envelope and the barrier layer system proper, after which the envelope is hermetically sealed. Preferably the stabilizing substance is introduced into the envelope in one of the above-mentioned manners. If, now, subsequently the barrier layer system for a certain period of time is loaded sufficiently heavily and/or heated to a sufficiently high temperature, the stabilizing substance will exert a permanent stabilizing action upon the barrier layer system. Hence, preferably the barrier layer system is subjected, after the sealing of the envelope, to a stabilization treatment so that the stabilizing action is ensured as completely as possible and at a higher rate. Preferably, this stabilization treatment consists in heating to a high temperature, for example a temperature exceeding 80° C. Generally, the stabilisation temperature is preferably chosen between 100° C. and 300° C. In general, the higher the stabilization temperature, the more quickly a stable final value is reached. The minimum stabilization temperature required presumably is related to the volatility of the stabilizing substance and is furthermore determined by the period of stabilization which is acceptable in practice. For a semi-conductor barrier layer system provided with phosphorus as the stabilizing substance, for example, a comparatively low stabilization temperature of, for example, 85° C. or 100° C., is sufficient. For antimony, however, 85° C. is unsatisfactory as a stabilization temperature. For antimony, at 140° C. the required stabilization period still is about one hundred hours. Bismuth generally requires a stabilization temperature of at least 140° C. Preferably, for antimony and bismuth the stabilization temperature exceeds 200° C. For many sulphides, selenides and tellurides, 140° C. has proved to be a suitable stabilization temperature. The higher the volatility, the lower generally can the stabilization temperature be. Hence, preferably sulphides, selenides and/or tellurides are used having a melting point of at most 600° C. In general, preferably the stabilization temperature is chosen not higher than is required in view of a practically acceptable stabilization period, since with heating to an excessively high temperature, permanent structure variations in the barrier layer system or chemical reactions of gases which may be present within the envelope, may become significant. Therefore, the stabilization temperature preferably is lower than the lowest melting temperature of the electrodes. However, stabilization at a temperature above the melting temperature of at least one of the electrodes is permissible, in particular if the barrier layer system is provided with a protective layer which may consist of silicone grease or lacquer.

Phosphorus, antimony and bismuth have proved to be suitable stabilizers. Alloys or compounds containing at least one of these elements are also very suitable. For example, excellent results have been obtained with alloys or compounds containing in addition to at least one of these elements a neutral constituent, such as lead or tin, and with alloys or compounds containing in addition to at least one of these elements a constituent which, at the stabilization temperature, is not detrimental to the barrier layer system, for example, indium or aluminum. Suitable compounds are, for example, the oxides of these elements, in particular $Sb_2O_3$. Sulphides, selenides and tellurides of phosphorus, antimony and bismuth are also very suitable. However, many other sulphides, selenides and tellurides, for example those of arsenic, also proved to be highly suitable. Other examples are GeS, $K_2S_5$, HgS, etc. It should be noted here that it has been found that the sulphides and selenides are much more suitable than the elements sulphur and selenium, which in general gave unsatisfactory results.

The gas filling can consist of the gases generally used for this purpose, for example, nitrogen or hydrogen or mixtures thereof. Good results are also obtained with air as the filling gas, and other inert filling gases such as argon have also proved suitable.

The invention is of particular importance for use in semi-conductor barrier layer systems the semi-conductor body of which consists of germanium or silicon. Particularly good results are obtained with semi-conductor barrier layer systems having a p-n-p transistor structure. The barrier layer systems in accordance with the invention show, in addition to a high stability, very favourable electrical properties, for example, a high current amplification factor, a low leakage current and a low noise factor. Many of these systems are even capable of withstanding being heated to a very high temperature of, say, from 200° C. to 300° C. However, the envelope must be hermetically sealed, preferably in a vacuum-tight manner. The term "hermetic" as used herein is to be understood to mean that the space within the envelope must be substantially sealed against the detrimental influence of ambient gases or vapours for a fairly long time. It has been found that, if the envelope is broken open, the stability of the semi-conductor barrier layer system in accordance with the invention is lost again.

The invention is of particular importance for barrier layer systems sealed in a glass envelope. When a barrier layer system is sealed in a glass envelope, the electrical properties generally greatly deteriorate owing to the high sealing-in temperature. If, however, a stabilizing substance in accordance with the invention is provided in the envelope, the electrical properties may deteriorate during the sealing process, but they can again be raised to their original level by a stabilization treatment of the kind described hereinbefore.

The invention will now be described more fully with reference to two figures and a number of examples.

Figure 2:
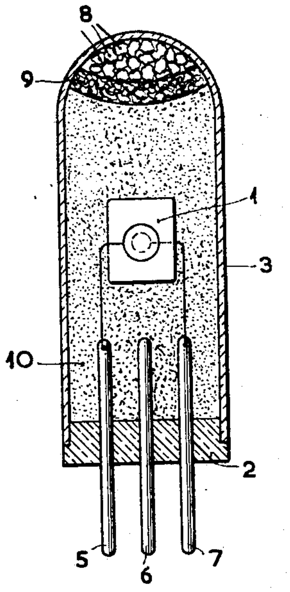

The FIGURES 1 and 2 are diagrammatic longitudinal sectional views of two different embodiments of a transistor provided with a hermetically sealed envelope in accordance with the invention.

FIGURE 1 shows an embodiment of a transistor in accordance with the invention in which the stabilizing substance admixed to silicone grease substantially fills the entire envelope. The semi-conductor barrier layer system 1 proper is sealed in a glass vacuum-tight envelope comprising two parts which are sealed to each other, a glass base 2 and a glass bulb 3. The space 4 between the barrier layer system 1 proper and the envelope 2, 3 is filled with an intimate mixture of silicone grease and stabilizing substance. The electrodes of the transistor are connected to supply leads 5, 6 and 7 which are brought out through the glass base 2.

In FIGURE 2, another embodiment of a transistor in accordance with the invention is shown. The embodiment of FIGURE 2 is distinguished from that of FIGURE 1 only by the manner in which the space between the barrier layer system 1 proper and the envelope 2, 3 is filled. A stabilizing substance 8 is provided within the envelope so as to be separated from the remaining space by means of a porous wall 9 which may consist of quartz wool or asbestos. The remaining space 10 may, if desired, be filled with an inert substance, such as sand.

Now the results obtained by the use of the invention will be compared with the results obtained with transistors mounted in the known manner. In the following embodiments relating to germanium transistors, the semi-conductor systems proper were p-n-p alloy transistors of one and the same production series which were manufactured by alloying an emitter pellet and a collector pellet, which both consisted of pure indium, and a base contact, which consisted of a tin-antimony alloy (95% by weight of Sn, 5% by weight of Sb), to a germanium wafer of thickness about 150 microns with the use of a temperature of 600° C. in a nitrogen hydrogen atmosphere for about 10 minutes. It should furthermore be noted that the values of the current amplification factor given hereinafter were always measured when the transistors had been cooled to room temperature, and that in the following examples relating to transistors in accordance with the invention, during the stabilization the noise and the leakage current improved and assumed stable values in agreement with the behaviour of the current amplification factor.

*Example 1*

A p-n-p germanium transistor was mounted in known manner in a vacuum-tight glass envelope which had previously been filled with dry silicone grease. The gas filling of the envelope was nitrogen. After the sealing-in process, $\alpha_{bc}$ was 91. After heating for two and 200 hours at 140° C. $\alpha_{bc}$ was 39 and 14, respectively. Furthermore, the noise and the leakage current had materially increased. So the stability of this known transistor was exceptionally bad.

*Example 2*

The $\alpha_{bc}$ of a transistor mounted in the same manner as described in Example 1 was 89 after sealing in. During the subsequent endurance test, in which the transistor was heated to 85° C., the $\alpha_{bc}$ fell to 30 in 1000 hours. In addition, the noise and the leakage current had increased. Thus, the stability of this transisistor mounted in known manner were also highly unsatisfactory.

*Example 3*

A germanium transistor the $\alpha_{bc}$ of which was 97 after final etching, was subsequently heated in a vacuum at 145° C. ("vacuum-baked") for 3 hours and sealed in a glass envelope in this condition. After the vacuum-baking, the $\alpha_{bc}$ was only 25, that is to say, one fourth of the original value. After an endurance test of 1000 hours at 85° C. this value was substantially maintained. Although the stability was satisfactory, the electrical properties, particularly the current amplification factor, of this transistor mounted in known manner were very unsatisfactory.

*Example 4*

An identical p-n-p germanium transistor was sealed in accordance with the invention in a glass envelope which had previously (FIGURE 1) been filled to about 60% of its capacity with dry silicone grease with an admixture of about 5% by weight of phosphorus. The total quantity of the silicone grease was about 60 mg. The gas-filling was nitrogen. After the sealing-in process, $\alpha_{bc}$ was 54. After the transistor had been heated to 85° C. for 200 hours, the $\alpha_{bc}$ had increased to 78. After heating to 85° C. for 500 and 1000 hours, the $\alpha_{bc}$ was 80 and 85 respectively. Thus, the stable final value was already substantially reached after heating at 85° for 200 hours. This transistor in accordance with the invention possesses not only a high stability but also a high current amplification factor. Comparative stabilisation tests made with similarly mounted transistors at elevated temperatures showed that by a stabilization at 140° C. a stable final value was already obtained after about 2 hours.

*Example 5*

Another p-n-p germanium transistor of the same series was mounted in the manner shown in FIGURE 2, 4 mg. of phosphorus having previously been provided as the stabilizing substance under a quartz wad, while the remaining part of the envelope was filled with dry sand. After sealing in, $\alpha_{bc}$ was 33, and after heating to 85° C. for 500 hours $\alpha_{bc}$ had risen to 86. After heating to 85° C. for 1000 and 2000 hours, $\alpha_{bc}$ was 88 and 87 respectively. Comparative tests made on similarly mounted transistors showed that at 140° C. a stable final value was reached after from 1 to 2 weeks.

*Example 6*

A p-n-p germanium transistor of the same series, series, which was mounted similarly to the one of Example 5 with the single difference that the barrier layer system proper had previously been provided with a lacquer layer (trade name of the lacquer "HK[15]"), was heated to 100° C. for 1500 hours. After sealing in, $\alpha_{bc}$ was 33. After 100, 1000 and 1500 hours, $\alpha_{bc}$ was 51, 64 and 64, respectively. Then this transistor was subjected to an endurance test, in which it was loaded by 50 mw. (collector base voltage 10 volts, emitter current 5 ma.) at an ambient temperature of 50° C. for 1000 hours. During this endurance test $\alpha_{bc}$ underwent substantially no change.

*Example 7*

A p-n-p germanium transistor was mounted in the manner shown in FIGURE 1, 5% by weight of indium phosphide being added to the dry silicone grease. After sealing in, $\alpha_{bc}$ was 93. Then the transistor was heated to 100° C. for 2000 hours. After 500, 1000 and 2000 hours, $\alpha_{bc}$ was 108, 116, and 118, respectively. Then the transistor was heated to 140° C. for 2000 hours. After 100, 500, 1000 and 2000 hours $\alpha_{bc}$ was 112, 123, 118 and 116, respectively.

*Example 8*

This example relates to a transistor according to the invention which was mounted in the manner described in Example 7 with only the difference that the barrier layer system proper had previously been provided with a lacquer layer. After sealing in, $\alpha_{bc}$ was 83. During the subsequent heating at 100° C., $\alpha_{bc}$ was 126, 126 and 130 after 500, 1000 and 2000 hours, respectively. Subsequently the transistor was subjected to an endurance test at 140° C. After 150, 500, 1000 and 2000 hours, $\alpha_{bc}$ was 124, 134, 136 and 132, respectively. In general, it was found that the transistors mounted with the use of a phosphorus alloy were even better capable of withstanding an endurance test at temperatures above 100° C., for example 140° C., than the transistors mounted with the use of phosphorus.

*Example 9*

Another germanium transistor of the same series was mounted with the use of an indium phosphorus alloy (90% by weight of P) in the manner shown in FIGURE 2. After sealing in, $\alpha_{bc}$ was 75. After heating at 140° C. for 100, 1000 and 2000 hours, $\alpha_{bc}$ was 89, 90 and 91 respectively. Comparative tests were also made on a similar transistor provided with a lacquer layer. It was found that in general the use of the lacquer layer provided better results with respect to the leakage current, in particular at high temperatures, for example 140° C. However, it was found that the transistor not provided with a lacquer layer generally is given a higher current amplification factor by the stabilization than a transistor provided with a lacquer layer.

*Example 10*

A p-n-p germanium transistor was mounted in a manner shown in FIGURE 1, about 5% by weight of antimony being admitted to the dry silicone grease. After sealing in, $\alpha_{bc}$ was 30. When the transistor was heated to 85° C., the current amplification factor hardly increased. Then the transistor was heated to 140° C. for 200 hours, after which $\alpha_{bc}$ had increased to 57. By a subsequent heating to 200° C. for 50 hours, $\alpha_{bc}$ rose further to 68. Then the transistor was heated to 300° C. for 6 hours, the value of $\alpha_{bc}$ remained substantially constant. Nor did $\alpha_{bc}$ undergo a substantial change in a further endurance test at 100° C. A comparable behaviour is also shown by similar transistors having their barrier layer systems provided with a lacquer layer.

*Example 11*

A p-n-p germanium transistor was mounted in the manner shown in FIGURE 2 with the use of antimony as stabilizer, the barrier layer system being provided with a lacquer layer. The amount of antimony was 4 mg. after sealing in, $\alpha_{bc}$ was 33 and, after stabilisation at 140° C. for 200 hours, it was 76. In a subsequent test, in which the transistor was heated to 50° C. and simultaneously loaded by 50 mw. for 1000 hours, this value underwent substantially no change.

*Example 12*

In another transistor of the same series, bismuth was used as stabilizer in the manner shown in FIGURE 1, 5% by weight of bismuth being admixed to the silicone grease, while the barrier layer system was provided with a lacquer layer. After sealing in, $\alpha_{bc}$ was 46. Heating to 140° C. for 100 hours produced only a decrease of $\alpha_{bc}$. Subsequently, the transistor was heated to 230° C. for 6 hours with the result that $\alpha_{bc}$ rose to 122. Then the transistor was heated to 50° C. for 2000 hours and simultaneously loaded by 50 mw. in the manner described hereinbefore. After 200, 1000 and 2000 hours, $\alpha_{bc}$ was 127, 130 and 128, respectively. Similar results were obtained by stabilization at 310° C. for 5 hours.

*Example 13*

A p-n-p germanium transistor of the same series was mounted in the manner shown in FIGURE 2 with the use of 4 mg. bismuth as stabiliser. The barrier layer system was previously provided with a lacquer layer. After sealing in, $\alpha_{bc}$ was 42. Then the transistor was heated to 230° C. for 6 hours. In this process, $\alpha_{bc}$ rose to 73 and this value was retained in a further endurance test which comprised heating to 50° C. and loading with 50 mw.

*Example 14*

A germanium transistor of the same series was mounted in the manner shown in FIGURE 1, dry silicone grease being mixed with 5% by weight of $SB_2O_3$, while the barrier layer system was provided with a lacquer layer. By heating to 140° C., $\alpha_{bc}$ was found mostly to decrease. After heating to 250° C. for 6 hours, $\alpha_{bc}$ was generally found to increase sharply, that is to say from 37 to 111. Subsequently the transistor was heated to 140° C. for 2000 hours. After 300, 1000 and 2000 hours, $\alpha_{bc}$ was 112, 118 and 120 respectively.

*Example 15*

A transistor which was mounted in the manner described in Example 14, but in which $Bi_2O_3$ was used as stabiliser instead of $Sb_2O_3$, also showed an increase of the current amplification factor when stabilized at 250° C.

*Example 16*

A germanium transistor of the same series was mounted in the manner shown in FIGURE 1, GeS (5% by weight) being admixed to the dry silicone grease as a stabiliser. After sealing in, $\alpha_{bc}$ was 67, after heating to 140° C. for 200 hours $\alpha_{bc}$ had risen to 122, and this value remained substantially constant in an endurance test which consisted of heating to 50° C. and simultaneous loading with 50 mw. for 500 hours. Comparative stabilisation tests at 100° C. improved that, in general, stabilisation at 140° C. provided even better results with respect to noise than at 100° C.

*Example 17*

In a transistor mounted in the manner shown in FIGURE 1, in which 5% by weight of HgS were admixed to the grease, $\alpha_{bc}$ was 30 after sealing in. After heating to 140° C. for 200 hours, $\alpha_{bc}$ had risen to 90 and this value remained substantially constant in a subsequent endurance test which consisted of heating to 50° C. and simultaneous electric loading with 50 mw. for 500 hours. With this stabiliser also, comparative stabilizing tests at 100° C. were less satisfactory with respect to the noise than tests at 140° C.

*Example 18*

In a transistor mounted in the manner shown in FIGURE 1, 5% by weight of $K_2S_5$ were admixed to the silicone grease as a stabiliser. After sealing in, $\alpha_{bc}$ was 26. After heating to 140° C. for 200 hours, $\alpha_{bc}$ had increased to 79 and this value underwent substantially no change in a subsequent endurance test, which consisted of heating to 50° C. and simultaneous electric loading with 50 mw. for 500 hours.

*Example 19*

A transistor mounted in the manner shown in FIGURE 1, in which 5% by weight of $Sb_2S_3$ were admixed to the silicone grease as stabiliser and the barrier layer system was provided with a lacquer layer, had an $\alpha_{bc}$ of 41 after sealing in. Subsequently the transistor was heated to 140° C. for 2000 hours. After 200, 500, 1000 and 2000 hours, $\alpha_{bc}$ was 92, 118, 120 and 120 respectively.

*Example 20*

A transistor mounted in the manner shown in FIGURE 1, in which 5% by weight of $As_2S_3$ were admixed to the silicone grease stabiliser and the barrier layer system was previously provided with a lacquer layer, had an $\alpha_{bc}$ of 92 after sealing in. Subsequently the transistor was heated to 140° C. for 2000 hours. After 100, 300, 1000 and 2000 hours, $\alpha_{bc}$ was 166, 251, 246 and 254 respectively. With this stabiliser, transistors not provided with a lacquer layer showed similar favourable results.

*Example 21*

In a p-n-p germanium transistor which was mounted in the manner shown in FIGURE 1, 5% by weight of $As_2Se_3$ being added as stabiliser to the silicone grease, while the barrier layer system had previously been provided with a lacquer layer, $\alpha_{bc}$ was 53 after sealing in. Subsequently the transistor was heated to 140° C. for 2000 hours, with the result that $\alpha_{bc}$ was 88, 108, 110 and 111 after 200, 300, 1000 and 2000 hours, respectively.

It should be noted that the invention obviously is not restricted to the stabilisers mentioned expressly in the examples, but that favourable results can also be obtained with different stabilisers from the said group of the sulphides, selenides, tellurides, phosphorus, antimony, bismuth and the compounds or alloys containing at least one of the latter three elements. Furthermore, the invention is not restricted to the stabiliser quantities mentioned or to the manners in which the substance is introduced in the envelope. In addition, the invention is not restricted to alloy transistors nor to germanium transistors. Silicon transistors, in particular p-n-p alloy transistors, can also be stabilized in this manner, for example with the use of phosphorus. Similar results can also be expected when applying the invention to semi-conductor barrier layer systems in which the semi-conductor body consists of a semi-conductor compound, for example an $A_{III}B_V$ compound such as GaAs, InP and the like.

What is claimed is:

1. A semiconductor device exhibiting stable characteristics comprising a hermetically sealed envelope, a semiconductive body and contacts to said body within the envelope, said body being constituted of a material selected from the group consisting of silicon, germanium and group $A_{III}$—$B_V$ semiconductive compounds, and within the envelope and communicating with the body a stabilizing substance selected from the group consisting of phosphorus, antimony, bismuth, compounds and alloys of one of said elements, sulphides, selenides, and tellurides.

2. A device as set forth in claim 1 wherein the envelope contains a filler material, and the stabilizing substance is a fine powder admixed with the filler.

3. A device as set forth in claim 2 wherein the stabilizing substance constitutes from 0.1 to 10% by weight of the filler.

4. A device as set forth in claim 2 wherein the filler is a silico-organic polymer.

5. A device as set forth in claim 1 wherein a lacquer layer is provided on the semiconductive body.

6. A semiconductor device exhibiting stable characteristics comprising a hermetically sealed envelope containing an interior porous wall, a semiconductive body and contacts to said body within the envelope on one side of said wall, said body being constituted of a material selected from the group consisting of silicon, germanium and group $A_{III}$—$B_V$ semiconductive compounds, and within the envelope but on the other side of said wall and communicating with the body a stabilizing substance selected from the group consisting of phosphorus, antimony, bismuth, compounds and alloys of one of said elements, sulphides, selenides, and tellurides.

7. A P-N-P transistor exhibiting stable characteristics comprising a hermetically sealed envelope, a semiconductive germanium body and contacts to said body within the envelope, and within the envelope and communicating with the body a stabilizing substance selected from the group consisting of phosphorus, antimony, bismuth, compounds and alloys of one of said elements, sulphides, selenides, and tellurides.

8. A transistor as set forth in claim 7 wherein the stabilizing substance has a melting point below 600° C. and is selected from the group consisting of sulphides, selenides, and tellurides.

9. A transistor as set forth in claim 7 wherein the stabilizing substance is selected from the group consisting of arsenic sulphide, arsenic selenide, and arsenic telluride.

10. A transistor as set forth in claim 7 wherein the stabilizing substance is selected from the group consisting of oxides of phosphorus, antimony, and bismuth.

11. A transistor as set forth in claim 7 wherein the stabilizing substance is selected from the group consisting of sulphides, selenides, and tellurides of one of the elements phosphorus, antimony, and bismuth.

12. A method of making a semiconductor device exhibiting stable characteristics, comprising introducing into an envelope a semiconductive body and contacts thereon, said body being constituted of a material selected from the group consisting of silicon, germanium and group $A_{III}$—$B_V$ semiconductive compounds, and introducing into the space between the body and the envelope walls a stabilizing substance selected from the group consisting of phosphorus, antimony, bismuth, compounds and alloys of one of said elements, sulphides, selenides, and tellurides, and thereafter hermetically sealing the envelope.

13. A method as set forth in claim 12 wherein, after the envelope is sealed, the device is heated at an elevated temperature.

14. A method as set forth in claim 13 wherein the elevated temperature lies between about 100° C. and 300° C.

References Cited in the file of this patent

UNITED STATES PATENTS

| | | |
|---|---|---|
| 1,989,311 | Fruth | Jan. 29, 1935 |
| 1,989,463 | Ruben | Jan. 29, 1935 |
| 2,929,971 | Amstel | Mar. 22, 1960 |